(12) United States Patent
Brewer

(10) Patent No.: US 8,435,606 B1
(45) Date of Patent: May 7, 2013

(54) POLYMER-INFUSED CARBON NANOTUBE ARRAY AND METHOD

(75) Inventor: Peter D. Brewer, Westlake Village, CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

(21) Appl. No.: 13/033,223

(22) Filed: Feb. 23, 2011

Related U.S. Application Data

(62) Division of application No. 12/185,000, filed on Aug. 1, 2008, now abandoned.

(51) Int. Cl.
*C23C 16/00* (2006.01)
*B05D 1/18* (2006.01)

(52) U.S. Cl.
USPC .................. 427/430.1; 427/248.1; 427/250

(58) Field of Classification Search ............... 427/249.1, 427/430.1
See application file for complete search history.

(56) References Cited

U.S. PATENT DOCUMENTS

| | | | |
|---|---|---|---|
| 6,407,922 B1 | 6/2002 | Eckblad et al. | |
| 6,924,335 B2 | 8/2005 | Fan et al. | |
| 7,038,299 B2* | 5/2006 | Furukawa et al. | 257/613 |
| 7,118,941 B2 | 10/2006 | Zhang et al. | |
| 2004/0097635 A1 | 5/2004 | Fan et al. | |
| 2004/0266065 A1 | 12/2004 | Zhang et al. | |
| 2006/0234056 A1* | 10/2006 | Huang et al. | 428/408 |
| 2007/0004081 A1* | 1/2007 | Hsiao | 438/106 |
| 2007/0116626 A1* | 5/2007 | Pan et al. | 423/447.1 |
| 2007/0244245 A1* | 10/2007 | Liu et al. | 524/496 |
| 2009/0029052 A1* | 1/2009 | Luo et al. | 427/294 |
| 2009/0266477 A1* | 10/2009 | Weisenberger | 156/185 |

* cited by examiner

*Primary Examiner* — David Turocy
(74) *Attorney, Agent, or Firm* — Christie Parker & Hale LLP

(57) ABSTRACT

A polymer-infused carbon nanotube (CNT) composite material and method of fabricating the same. A CNT array is provided on a substrate. A capping layer is deposited on the CNT array such that the CNT array is between the capping layer and the substrate. A polymer material is infused into the CNT array. Then the substrate and the capping layer are removed. The array of carbon nanotubes included in the polymer-infused CNT composite material are substantially aligned in the same direction.

9 Claims, 4 Drawing Sheets

POLYMER-INFUSED CARBON NANOTUBE ARRAY AND METHOD

CROSS-REFERENCE TO RELATED APPLICATION

The present invention is a divisional application of abandoned U.S. patent application Ser. No. 12/185,000, filed Aug. 1, 2008, which is related to copending and commonly assigned application Ser. No. 12/185,020, titled "CARBON NANOTUBE ARRAY INTERFACE MATERIAL AND METHODS," filed on Aug. 1, 2008. The entire content of which is hereby expressly incorporated by reference.

BACKGROUND OF THE INVENTION

1. Field of the Invention

The present invention relates to the field of polymer-infused carbon nanotube (CNT) array composite material and method of fabricating the same.

2. Description of the Related Art

Polymer-infused CNT array composites, membranes, and gaskets have many useful applications such as thermal interface materials (heat transfer elements for electronics), chemical and biological sensors (chemically modified CNTs as channels or electrical devices), filtration devices (nano-fluidic channels), reversible adhesives (artificial gecko feet) and electrical interconnects (high electrical conductivity).

Various methods are known in the art to infuse CNTs with a polymer material. These known methods include: (1) solution mixing of polymer and CNTs; (2) spin-coating; (3) melt blending and; (4) in-situ polymerization in the presence of CNTs. These methods of fabrication of polymer-infused CNT arrays have a number of shortcomings such as disruption of the order and uniformity of the CNT arrays, clumping of the CNT arrays, incomplete infusion of the polymer into the CNT arrays, and cracking of the resulting structure.

U.S. Pat. No. 6,407,922 discloses a thermally conductive material employing CNTs. The thermally conductive material includes a matrix material and CNTs incorporated therein. The thermally conductive material includes a first surface adjacent a heat source and a second opposite surface adjacent a heat dissipator. The first surface has a smaller area than the second surface. The CNTs each extend generally between the first and second surfaces. However, the CNTs are not regularly arranged in the matrix material, and can have poor orientation relative to the first and second surfaces. Consequently, heat cannot be uniformly and efficiently transferred from the first surface to the second surface.

U.S. Pat. No. 6,924,335 discloses a method for making thermal interface material including a polymer matrix and a CNT array. This method involves immersing the CNT array in a liquid pre-polymer solution to infuse polymer into a CNT array to form a polymer matrix embedded with CNTs. However, this method also fails to maintain the generally uniform flat surface and vertical alignment of the CNT array.

Therefore, there remains a need for a method to fabricate polymer-infused CNT array composites that can overcome at least the shortcomings discussed above. However, in view of the prior art considered as a whole at the time the present invention was made, it was not apparent to those of ordinary skill in the pertinent art how the identified need could be fulfilled.

SUMMARY OF THE INVENTION

Embodiments of the present invention provide a polymer-infused CNT array composite and method of fabricating the same. Some aspects and features of the embodiments include: 1) the formation of freestanding CNT array composites structure infused with polymer material; 2) an infusion process that maintains the vertical alignment order surface topography of the CNTs; 3) a fabrication process that fully infiltrates/infuses the CNT arrays; 4) the ability to fabricate CNT polymer composites with a wide range of thickness; 5) the ability to incorporate wide range of polymer materials into a CNT array; 6) the fabrication of membrane structures with CNTs extending through the polymer layer; and 7) a simpler fabrication process for applying polymer material into CNT array.

According to one embodiment of the present invention, a method of fabricating a polymer-infused carbon nanotube composite material is provided. A carbon nanotube array is provided on a substrate. A capping layer is deposited on the carbon nanotube array. A polymer material is infused into the carbon nanotube array, thereby providing the polymer-infused carbon nanotube composite material including a plurality of aligned carbon nanotubes. The substrate may be removed, and the capping layer may be removed. The substrate may include a silicon substrate. The capping layer may not substantially penetrate the carbon nanotube array. The capping layer may include silicone dioxide or metal (e.g., copper). The capping layer may be deposited by one of evaporation, electroplating, or sputtering technique. The polymer material may be infused by first wicking a material at one end of the carbon nanotube array and then polymerizing the material. The material may have a viscosity in the range of about 1-10 cP. The material may include one of benzocyclobutene or photoresist. The carbon nanotube array may protrude from the polymer material.

According to another embodiment of the present invention, a method of fabricating a polymer-infused carbon nanotube composite material is provided. A carbon nanotube array is provided on a substrate. A first capping layer is deposited on the carbon nanotube array. The substrate is removed. A second capping layer is deposited on the carbon nanotube array such that the carbon nanotube array is between the first capping layer and the second capping layer. A polymer material is infused into the carbon nanotube array, thereby providing the polymer-infused carbon nanotube composite material including a plurality of aligned carbon nanotubes. The first and the second capping layers may be removed. A handle wafer may be attached to the first capping layer prior to removing the substrate. The substrate may include a silicon substrate. The first and second capping layers each may include silicone dioxide or metal (e.g., copper). The first and second capping layers may be deposited by one of evaporation technique, electroplating, or sputtering. The polymer material may be infused by first wicking a material at one end of the carbon nanotube array and then polymerizing the material. The material may have a viscosity in the range of about 1-10 cP. The material may include one of benzocyclobutene or photoresist. The carbon nanotube array may protrude from the polymer material.

According to yet another embodiment of the present invention, an interface composite material is provided. The interface composite material includes an array of carbon nanotubes and a polymer material. The carbon nanotubes are substantially aligned in the same direction. The carbon nanotubes each have a first end for constituting a first interface surface and a second end for constituting a second interface surface opposite to the first surface. The polymer material infuses among the carbon nanotubes between the first interface surface and the second interface surface. The carbon nanotubes may be substantially perpendicular to the first interface surface and the second interface surface. The carbon nanotubes may protrude from the polymer material in a direction from the first interface surface. The carbon nanotubes may protrude from the polymer material in a direction from the second surface. The polymer material may be polymerized benzocyclobutene or photoresist.

According to still a further embodiment of the present invention, an interface composite material is provided. The interface composite material includes an array of carbon nanotubes. The carbon nanotubes are aligned in the same direction and each have a first end for constituting a first interface surface and a second end for constituting a second interface surface opposite to the first interface surface. A polymer material is infused among the carbon nanotubes between the first interface surface and the second interface surface. A capping layer is on one of the first interface surface or the second interface surface.

The carbon nanotubes may be substantially perpendicular to the first interface surface and the second interface surface. The carbon nanotubes may protrude from the polymer material in a direction from the first interface surface. The carbon nanotubes may protrude from the polymer material in a direction from the second interface surface. The polymer material may be polymerized benzocyclobutene or photoresist. The capping layer may include one of silicone dioxide or metal.

DETAILED DESCRIPTION

Embodiments of the present invention disclose methods for infiltrating a polymer material into the interior regions of a CNT array. These methods facilitate the fabrication of freestanding CNT-polymer composite material with highly aligned CNT structure. The embodiments overcome existing problems associated with processing CNT array using liquids (e.g., water, acids, solvents, and polymer precursors) that cause the surface of the CNT array to deform during the wetting and drying processes, resulting in degradation of the vertical alignment among the CNTs. For many applications including heat transfer, electrical interconnects and sensors, degradation of the highly aligned CNTs structure limits the performance of the material employing CNTs. These problems are overcome by the embodiments described in fuller detail below.

In a first exemplary embodiment, FIGS. 1-5 illustrate a method of fabricating polymer-infused CNT composite material. The method includes: (1) fabricating a CNT array on a substrate; (2) depositing a capping layer on the CNT array; (3) infusing polymer material into the interior region of the CNT array defined by the capping layer and the growth substrate, (4) removing the growth substrate from the polymer/CNT composite structure; and (5) removing the capping layer. Now, each step of the first exemplary method will be discussed in more detail.

Figure 1:
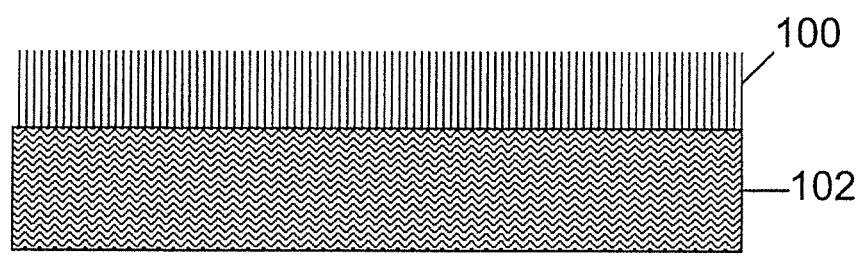
FIG. 1 is a schematic side elevation view showing a CNT array on a substrate.

FIG. 1 shows a CNT array 100 fabricated on a substrate 102. The CNT array can be fabricated by any conventional method known to a person skilled in the pertinent art. Material that can be used as the substrate 102 includes, but not limited to, silicon, quartz, glass, and alumina. As an example, the CNT array 100 can be fabricated on a silicon substrate 102 by first depositing a layer of catalyst (not shown) on the silicon substrate 102, annealing the treated substrate 102 in air at a suitable temperature, and introducing a carbon source gas to the annealed substrate 102. However, other methods of fabricating CNT array 100 can be used. The length of the CNTs can be around 10 to 200 microns.

Figure 2:
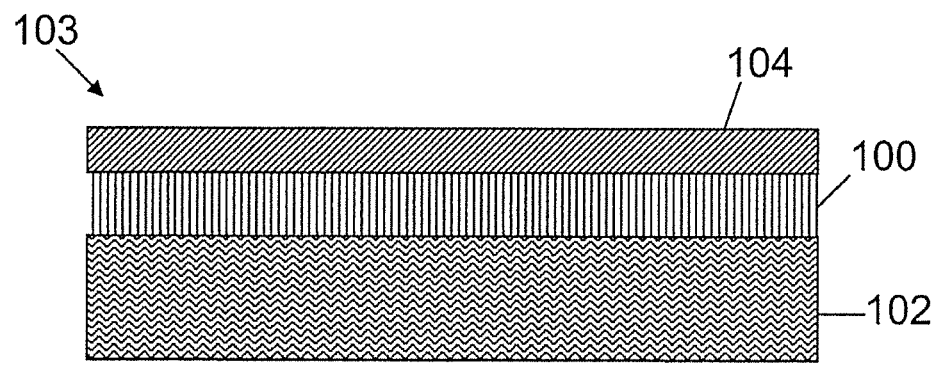
FIG. 2 is a schematic side elevation view showing a first capping layer on the CNT array of FIG. 1.

FIG. 2 shows a capping layer 104 deposited on the CNT array 100. The capping layer 104 can be made of a material that can be attached to the CNT array 100 without significantly penetrating (e.g., soaking) into the CNT. For example, the capping layer 104 may be made of, but not limited to, metal (e.g., copper, aluminum) or silicone dioxide. In the first exemplary embodiment, the capping layer 104 is made of copper and deposited on the CNT array 100 by evaporation techniques. However, other suitable material can be used for the capping layer 104. In selecting the proper material for the capping layer 104, an important consideration is that the material should quickly solidify once coming into contact with the CNT array 100. As a result, the material used for the capping layer 104 does not infiltrate the spaces between CNTs significantly to alter the vertical alignment of the CNTs.

The capping layer 104, the CNT array 100 and the substrate 102 form a composite structure 103 that physically constrains the CNT array 100. This is accomplished by fixing the ends of the CNTs at the growth substrate 102 at one end and the capping layer 104 at the other end. A consideration on the fabrication of the capping layer 104 is that the capping layer 104 must be continuous and with sufficient thickness to resist changes due to the infusion process of a polymer material into the CNT array 100. In one embodiment, a five micron thick copper layer for the capping layer 104 is shown to be adequate for the subsequent processing steps. The capping layer 104 can be deposited using evaporation techniques, however, other standard techniques such as electroplating or sputtering may also be used.

Figure 3:
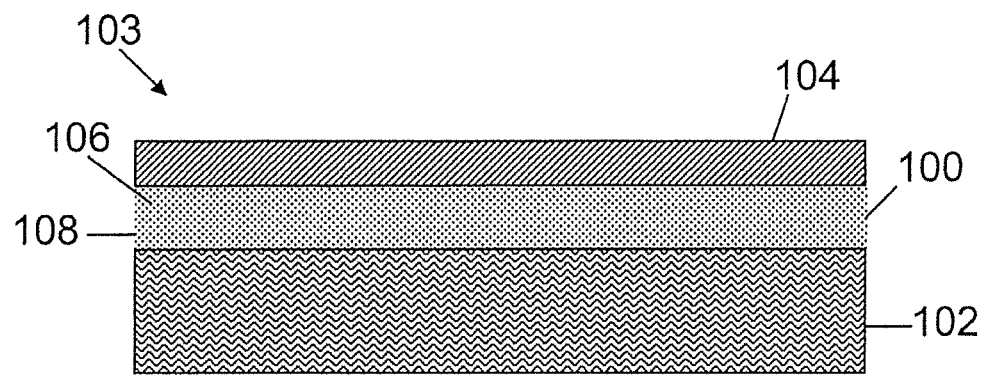
FIG. 3 is a schematic side elevation view showing the CNT array of FIG. 2 infused with a polymer material.

FIG. 3 illustrates the CNT array 100 being infused with a polymer material 106. However, in some embodiments, the polymer material 106 can be replaced with a pre-polymer (e.g., a monomer or a polymer precursor material). The composite structure 103 facilitates a controlled infusion of a polymer material 106 into the CNT array 100 with the polymer material 106 constrained to the interior space of the CNT array 100. The infusion of the polymer material 106 is accomplished, for example, by wicking a polymer precursor material between the capping layer 104 and the CNT growth substrate 102 at one end 108 of the CNT array 100. By way of example, one end of the composite structure 103 can be immersed into a reservoir containing a polymer precursor material solution to infuse the polymer precursor material into the CNTs by a wicking phenomenon. The polymer precursor material should have a low viscosity (e.g., 1-10 cP). The polymer precursor material can be, but not limited to, monomer, benzocyclobutene or photoresist. Furthermore, some other exemplary polymer precursor material suitable for this application includes BCB-3500 (a benzocyclobutene) also sold under the trademark CYCLOTENE, SU-8 (a photoresist), and AZ-1550 (a photoresist), but the present invention is not limited thereto. Once the CNT array 100 is completely infiltrated with the polymer precursor material, the polymer precursor material is polymerized by a suitable method known in the art according to the type of polymer precursor material and type of substrate used. This method allows the CNT array 100 be substantially and completely filled with the polymer material 106. Furthermore, the structure and alignment of the CNT array 100 are substantially maintained during the polymer infusion process since the CNTs are constrained by the composite structure 103 formed with the ends of the CNTs affixed at the capping layer 104 and the substrate 102. In addition, the polymer material 106 that is infused between the capping layer 104 and the CNT growth substrate 102 exerts a pressure against the capping layer 104 that tends to align the CNTs.

Figure 4:
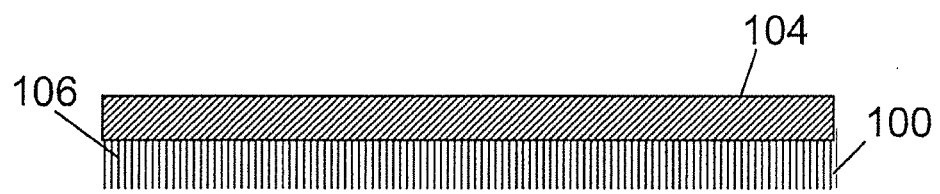
FIG. 4 is a schematic side elevation view showing the substrate being removed from the polymer-infused CNT array of FIG. 3.

FIG. 4 shows the substrate 102 of FIG. 3 removed from the CNT array 100. The method used to remove the substrate 102 depends on the type of substrate used to grow the CNT array 100. In an exemplary embodiment, if the substrate 102 is a silicon substrate, the polymer-infused CNT array 100 can be removed from the substrate 102 using an underlying release layer (not shown) such as $SiO_2$ with a thickness around 1000-5000 Å, this release layer is formed on the silicon substrate 102 prior to the CNT array 100 being fabricated. The composite structure 103 of FIG. 3 can be immersed in a 10% buffered hydrofluoric acid (HF) solution for about one to ten minutes to remove the substrate 102.

Figure 5:
FIG. 5 is a schematic side elevation view showing the first capping layer being removed from the polymer-infused CNT array of FIG. 4.

FIG. 5 shows a completed polymer-infused CNT array composite material according to a first embodiment of the present invention. The capping layer 104 of FIG. 4 is removed from the CNT array 100 using standard etching method depending on the type of capping material used. In an exemplary embodiment using copper as the capping layer 104, the capping layer 104 can be removed by standard wet copper etching method known in the art. The CNT array 100 extends past the surface of the polymer layer at the capping layer side, and the CNT array 100 is flush with the other surface of the polymer layer at the substrate side.

In a second embodiment, FIGS. 6-10 illustrate an alternative approach for fabricating a polymer-infused CNT array composite material.

Figure 6:
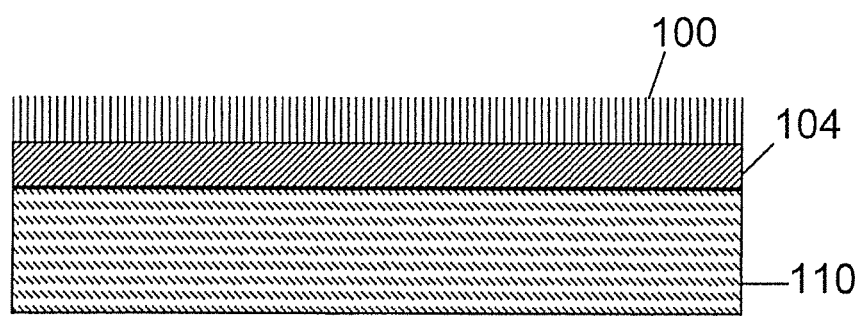
FIG. 6. is a schematic side elevation view showing a handle wafer attached to the CNT array of FIG. 2.
Figure 7:
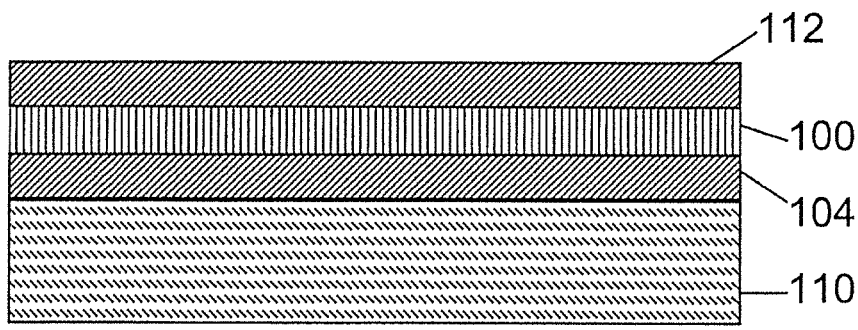
FIG. 7 is a schematic side elevation view showing a second capping layer attached to the CNT array of FIG. 6.

FIG. 6 shows the CNT array 100 and the capping layer 104 being transferred to a handle wafer 110 for the application of a second capping layer 112 (shown in FIG. 7). The second capping layer 112 may be made of a similar material as the capping layer 104. The handle wafer 110 allows the easy handling of the CNT array during the process of depositing a second capping layer 112 (shown in FIG. 7).

FIG. 7 shows a second capping layer 112 deposited on the CNT array 100. After the application of the second capping layer 112, the CNT array 100 is sandwiched between the first capping layer 104 and the second capping layer 112. The second capping layer 112 can be deposited using the same method as the first capping layer 104 as discussed in the previous sections with regard to the first embodiment.

Figure 8:
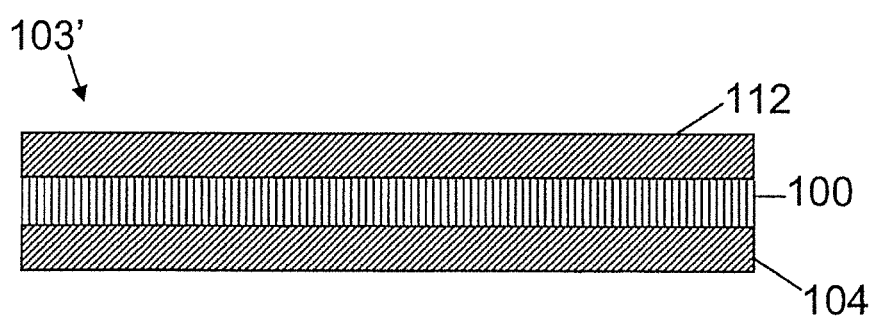
FIG. 8 is a schematic side elevation view showing the handle wafer being removed from the CNT array of FIG. 7.

FIG. 8 shows the handle wafer removed from the first capping layer 104. The capping process creates a composite structure 103' that physically constrains the CNT array 100. This is accomplished by fixing the ends of the CNTs at the first capping layer 104 at one end and the second capping layer 112 at the other end. This arrangement places restrictions on the fabrication of the second capping layer 112 such that the second capping layer 112 must be continuous and with sufficient thickness to resist changes during the infusion process of a polymer material into the CNT array 100. In an exemplary embodiment, a five micron thick copper layer for the second capping layer 112 is shown to be adequate for the subsequent processing steps. The second capping layer 112 can be deposited using evaporation techniques, however, other standard techniques such as electroplating or sputtering could also be used.

Figure 9:
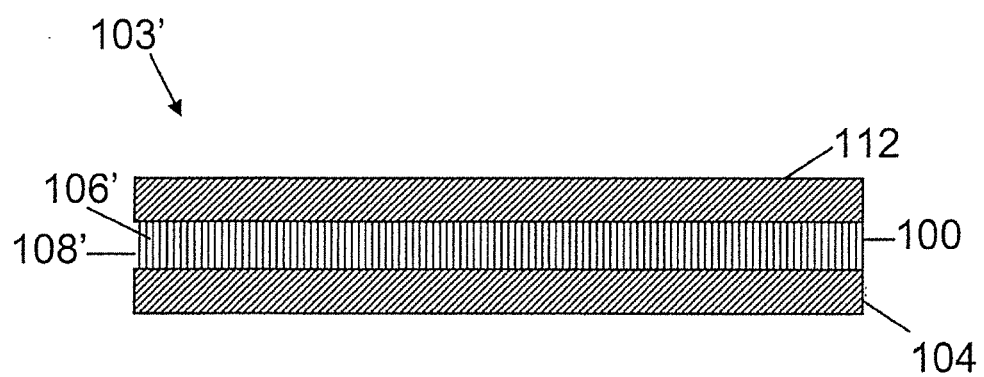
FIG. 9 is a schematic side elevation view showing CNT array of FIG. 8 being infused with a polymer material.

FIG. 9 illustrates the CNT array 100 being infused with a polymer material 106'. The composite structure 103' facilitates the controlled infusion of a polymer material 106' into the CNT array 100 with the polymer material 106' constrained to the interior space of the CNT array 100. The infusion of the polymer material 106' is accomplished by wicking a polymer precursor material between the first capping layer 104 and the second capping layer 112 at one end 108' of the CNT array 100. The polymer precursor material can be the same one used in the first embodiment as illustrated in FIG. 1-5.

Figure 10:
FIG. 10 is a schematic side elevation view showing the capping layers being removed from the polymer-infused CNT array of FIG. 9.

FIG. 10 shows a completed polymer-infused CNT array composite material 200 according to a second embodiment of the present invention. The capping layers 104 and 112 are removed from the CNT array 100 using standard etching method depending on the type of capping material used as discussed in the previous sections. In this embodiment, the CNT array 100 extends past the surface of the polymer material 106' at both sides. This method allows the CNT array 100 to be substantially and completely filled with the polymer material 106'. Furthermore, the structure and alignment of the CNT array 100 are substantially maintained during the polymer infusion process since the ends of the CNTs are affixed on the capping layers 104 and 112.

Although the present invention had been described in considerable detail with reference to certain exemplary embodiments thereof, other versions are possible without exceeding the spirit and scope of the present invention. Therefore, the appended claims should not be limited to the description of the embodiments described herein.

What is claimed is:

1. A method of fabricating a polymer-infused carbon nanotube composite material, the method comprising:
   providing a carbon nanotube array comprising a plurality of aligned carbon nanotubes on a substrate;
   depositing a capping layer on the carbon nanotube array, wherein the capping layer comprises metal and is deposited by one of evaporation, electroplating, or sputtering technique; and
   wicking a polymer material into the carbon nanotube array at just one end of the carbon nanotube array and polymerizing the polymer material, thereby providing the polymer-infused carbon nanotube composite material comprising the plurality of aligned carbon nanotubes with their alignment substantially maintained,
   wherein the polymer material has a viscosity in the range of about 1-10 cP.

2. The method of claim 1, the method further comprising: removing the substrate and the capping layer.

3. The method of claim 1, wherein the polymer material comprises one of benzocyclobutene or photoresist.

4. The method of claim 1, wherein the carbon nanotube array protrudes from the polymer material.

5. A method of fabricating a polymer-infused carbon nanotube composite material, the method comprising:
 providing a carbon nanotube array comprising a plurality of aligned carbon nanotubes on a substrate;
 depositing a first capping layer on the carbon nanotube array;
 removing the substrate;
 depositing a second capping layer on the carbon nanotube array such that the carbon nanotube array is between the first capping layer and the second capping layer, wherein the first and second capping layers comprise metal and are deposited by one of evaporation, electroplating, or sputtering technique; and
 wicking a polymer material into the carbon nanotube array at just one end of the carbon nanotube array and polymerizing the polymer material, thereby providing the polymer-infused carbon nanotube composite material comprising the plurality of aligned carbon nanotubes with their alignment substantially maintained,
 wherein the material has a viscosity in the range of about 1-10 cP.

6. The method of claim 5, further comprising removing the first capping layer and the second capping layer.

7. The method of claim 5, further comprising attaching a handle wafer to the first capping layer prior to removing the substrate.

8. The method of claim 5, wherein the polymer material comprises one of benzocyclobutene or photoresist.

9. The method of claim 5, wherein the carbon nanotube array protrudes from the polymer material.

* * * * *